(12) United States Patent
Kipnis et al.

(10) Patent No.: US 7,307,331 B2
(45) Date of Patent: Dec. 11, 2007

(54) INTEGRATED RADIO FRONT-END MODULE WITH EMBEDDED CIRCUIT ELEMENTS

(75) Inventors: Issy Kipnis, Berkeley, CA (US); Valluri R. Rao, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 693 days.

(21) Appl. No.: 10/944,057

(22) Filed: Sep. 16, 2004

(65) Prior Publication Data

US 2006/0025102 A1 Feb. 2, 2006

Related U.S. Application Data

(63) Continuation-in-part of application No. 10/816,264, filed on Mar. 31, 2004.

(51) Int. Cl.
*H01L 27/02* (2006.01)
(52) U.S. Cl. .............. 257/499; 257/528; 257/532; 257/E27.009; 327/565
(58) Field of Classification Search .............. 257/499, 257/528, 532, E27.009; 327/564
See application file for complete search history.

(56) References Cited

U.S. PATENT DOCUMENTS

| | | | |
|---|---|---|---|
| 4,672,421 A | 6/1987 | Lin | |
| 5,446,309 A | 8/1995 | Adachi et al. | |
| 6,274,937 B1 | 8/2001 | Ahn et al. | |
| 6,420,197 B1 | 7/2002 | Ishida et al. | |
| 6,529,093 B2 | 3/2003 | Ma | |
| 6,531,668 B1 | 3/2003 | Ma | |
| 6,573,822 B2 | 6/2003 | Ma et al. | |
| 6,693,499 B2 * | 2/2004 | Goyette et al. | ............. 333/118 |
| 6,822,535 B2 | 11/2004 | Ma et al. | |
| 6,850,133 B2 | 2/2005 | Ma | |
| 6,880,235 B2 | 4/2005 | Ma | |
| 6,933,808 B2 | 8/2005 | Ma et al. | |
| 6,934,448 B2 | 8/2005 | Akashi et al. | |
| 6,972,650 B2 | 12/2005 | Ma | |
| 6,998,691 B2 | 2/2006 | Baugh et al. | |
| 7,065,327 B1 * | 6/2006 | Macnally et al. | ............. 455/78 |

(Continued)

FOREIGN PATENT DOCUMENTS

WO WO 00/39853 7/2000

(Continued)

OTHER PUBLICATIONS

ELECTRONICSWEEKLY.COM, 3GSM: First Silicon GPRS Radio Front End From Phillips:, Feb. 23, 2004, 2 pages.

(Continued)

*Primary Examiner*—Evan Pert
*Assistant Examiner*—Victor A. Mandala, Jr.
(74) *Attorney, Agent, or Firm*—Blakely, Sokoloff, Taylor & Zafman LLP

(57) ABSTRACT

A highly integrated radio front-end module. In one embodiment a semiconductor substrate is processed with various circuit components in the substrate, as well as interconnections for the various circuit components, embedding the circuit components into the substrate. One or more circuit components may be further connected with a separate integrated circuit, the separate integrated circuit bonded to the semiconductor substrate via contact points processed into the substrate.

20 Claims, 4 Drawing Sheets

U.S. PATENT DOCUMENTS

| | | |
|---|---|---|
| 7,088,964 B2 * | 8/2006 | O .............................. 455/90.3 |
| 2003/0020094 A1 | 1/2003 | Shrauger |
| 2003/0045044 A1 | 3/2003 | Dentry et al. |
| 2003/0132455 A1 * | 7/2003 | Utsunomiya et al. ........ 257/200 |
| 2004/0140870 A1 * | 7/2004 | Kishimoto .................. 333/193 |
| 2004/0232523 A1 * | 11/2004 | Shamsaifar et al. ......... 257/602 |
| 2005/0030128 A1 | 2/2005 | Ma et al. |
| 2005/0122001 A1 | 6/2005 | Ma et al. |
| 2005/0134413 A1 | 6/2005 | Bar et al. |
| 2005/0140468 A1 | 6/2005 | Wang |

FOREIGN PATENT DOCUMENTS

| | | |
|---|---|---|
| WO | WO 2005/000733 A2 | 1/2005 |
| WO | WO 2005/000733 A3 | 1/2005 |

OTHER PUBLICATIONS

SEARCHNETWORKING.COM, "Balun", 3 pages.

Dallas Semiconductor Maxim, "Silicon Germanium (SiGe) Technology Enhances Radio Front-End Performance", Mar. 15, 2000, 7 pages.

Jong-Soo Lee, "MCM Technology for RF Tunable Band Pass Filters Implemented by Integration of GaAs FETs and Selectively Oxidized Porous Silicon (SOPS)", *IEEE 2000 Proceedings 50th Electronic Components and Technology Conference*, May 21-24, 2000, Las Vegas, NV, p. 426-431, XP-001054602.

Robert Aigner, "RF-MEMS Filters Manufactured on Silicon: Key Facts About Bulk-Acoustic-Wave Technology", *2003 Topical Meeting on Silicon Monolithic Integrated Circuits in RF Systems*, Digest of Papers (Cat. No. 03EX668), 2003, p. 157-161, XP-002356308.

Linda P.B. Katehi, "MEMS and Si Micromachined Circuits for High-Frequency Applications", *IEEE Transactions on Microwave Theory and Techniques*, vol. 50, No. 3, Mar. 2002, p. 858-866, XP-001102280.

Clark T-C Nguyen, "Communications Applications of Microelectromechanical Systems", Proceedings 1998 Sensors Expo, May 19-21, 1998, San Jose, CA, p. 447-455, XP-002190275.

Pending U.S. Appl. No. 10/816,264, filed Mar. 31, 2004; Final Office Action dated Jul. 17, 2007.

\* cited by examiner

INTEGRATED RADIO FRONT-END MODULE WITH EMBEDDED CIRCUIT ELEMENTS

RELATED APPLICATION

This Application is a continuation-in-part of application Ser. No. 10/816,264, filed Mar. 31, 2004, and claims the benefit of that Application.

FIELD

Embodiments of the invention relate to silicon integrated circuits, and particularly to a radio front-end module with circuit components embedded on a substrate.

BACKGROUND

Many circuits currently use discrete components and/or integrated circuits (ICs) that may be produced with different types of processing and materials. Some of the different types of processing and materials may include complimentary-metal-oxide-semiconductor (CMOS), gallium-arsenide (GaAs), lithium tantalate (LiTaO$_3$), and silicon-germanium (SiGe). Traditionally many of these devices have been assembled and interconnected on ceramic or organic interconnect devices that have traces to interconnect the various ICs and/or passives. The resulting interconnected circuit is then packaged as a single component.

FIG. 1 is a known example of interconnecting various ICs with an interconnect device. Passive substrate 110 represents traditional interconnect devices, typically organic material (e.g., FR4) or ceramics. Passive substrate 110 is passive because it has no circuit functionality except to assemble and interconnect the various circuit components. All circuit functionality, such as processing, manipulating, affecting, etc., signals in the circuit is performed in the various circuit elements assembled on top of passive substrate 110. Thus, the ICs, switches, and passives shown in FIG. 1 are the functional circuit elements. The main advantage to using passive substrate 110 is that it is relatively inexpensive, generally only requiring that contact pads and interconnect traces be manufactured onto passive substrate 110. The circuit components are then bonded or soldered to passive substrate 110. Thus, various ICs of potentially many disparate processing technologies and/or procedures can all be packaged as a single component.

Examples of various circuit elements include RLC 120, which represents discrete passive components such as resistors, inductors, and capacitors, and filters created with such passive components. These components are used to passively process signals occurring in system 100. ICs of differing processing technologies and materials are also shown as CMOS 130, SiGe 140, LiTaO$_3$ 150, and switch 160.

CMOS 130 represents ICs that are made with complimentary metal (or other conductor) oxide semiconductor (e.g., silicon) processing. SiGe 140 represents ICs that are manufactured with silicon germanium processing. Because of the differences in processing of these two technologies, processing of circuits using these different technologies occurs on different substrates and interconnecting occurs on an interconnect device such as passive substrate 110. The use of different types of circuits made with the different technologies is assumed to be well understood in the art, and consequently will not be discussed herein. Note that the interconnecting of ICs 130, 140, 150, and 160 may be performed by flip-chipping the IC and bonding to bumps, or by the use of wire bonds, as shown with SiGe 140. Additionally, the various ICs shown could be bare die rather than packaged.

LiTaO$_3$ 150 represents devices processed on a lithium tantalite substrate, which is a boutique processing technology that is traditionally used with surface acoustic wave (SAW) filters. Switch 160 is shown as one traditional element that is processed using GaAs to provide fast switching, for example, switches in radio frequency (RF) devices.

Input/Outputs 170 are used in packaging system 100. Input/Outputs 170 pads or bumps use vias through passive substrate 110 to provide interconnection to the circuitry of system 100 to the packaging of system 100. The interconnection to the packaging may be through wire bonding or metal traces connecting to the packaging pins.

Despite the inexpensive interconnect provided by passive substrate 110, there may be undesired expenses in the processing of the various ICs shown in FIG. 1. For example, many ICs use boutique processing technologies such at LiTaO$_3$ or GaAs that can be significantly more costly than silicon-based processing. However, use of these processes has been necessary to achieve the desired performance. Integrating these components made with boutique processes with strictly silicon-based components has proven costly.

Another example of the expense in traditional practice is that many circuits require the use of resistors, capacitors, inductors, and passive filters. These components may be integrated directly on the IC, or they may be discrete components, such as LTCC (low temperature co-fired ceramic) devices, that require bonding to passive substrate 110. However, there are costs associated with using discrete passive components, as well as directly integrating passives on modern ICs manufactured with high precision (e.g., 90 nm) processing. The higher precision processing is used to scale ICs with active devices such as transistors, which are typically scaleable. The increased cost of manufacturing may be justified by the increases in performance of the resulting devices. However, higher precision processing does little or nothing to increase performance of components such as the passives that do not scale. Also, for devices such as voltage regulation circuits and certain sensors, non-high-end processing is also perfectly viable for producing circuit elements of acceptable performance, making the use of high-end processing for such devices wasteful. Thus, integrating these devices on ICs consisting of scaleable active device with modern processing techniques is wasteful of processing costs as well as valuable die real estate.

BRIEF DESCRIPTION OF THE DRAWINGS

The description of embodiments of the invention includes various illustrations by way of example, and not by way of limitation in the figures and accompanying drawings, in which like reference numerals refer to similar elements.

DETAILED DESCRIPTION

Methods and apparatuses are described for using a silicon backplane to integrate and interconnect electronic components (e.g., passive, switch, filter, analog transistor, power transistor, etc.) that cannot be built on highly scalable very large scale integration (VLSI) processes in a cost effective manner. With a silicon backplane device, functional circuit elements may be monolithically integrated on the interconnect device with the interconnections. In one embodiment a silicon backplane has components and interconnects embedded in the substrate with contacts to interconnect to other ICs.

In one embodiment all components integrated directly into the silicon of a silicon backplane are manufactured with monolithic processing. Monolithic is to be understood as being part of, or consistent with, the single crystalline structure of the silicon backplane. Monolithic may be understood as processing where the resulting integrated components/interconnects are part of the silicon wafer. Another way to understand monolithic is that the devices integrated with monolithic processing are embedded in the silicon substrate (in the wafer). This may be, for example, in contrast to modern VLSI CMOS processes that have many layers, such as interconnect layers on top of integrated devices. Thus, monolithic may or may not be understood as including polysilicon grown off the silicon crystal of the silicon substrate. This would generally not include devices in a silicon substrate whose processing results in a device with layers (e.g., CMOS). Monolithic is meant to include the use of conductors, such as traces and contact pads. It may also include some active devices, for example, transistors, as discussed below.

Figure 1:
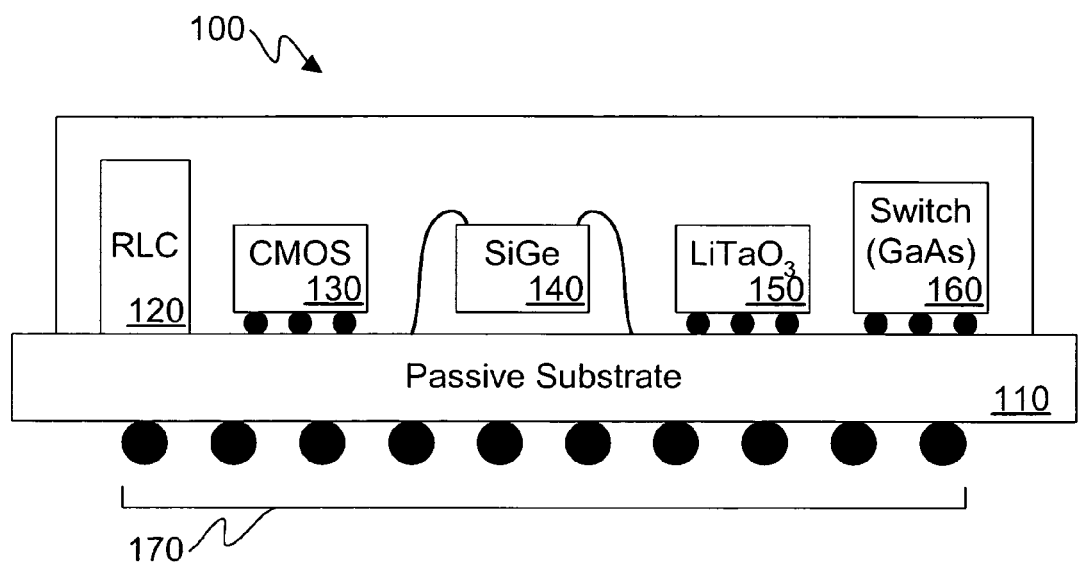
FIG. 1 is a known example of interconnecting various ICs with an interconnect device.
Figure 2:
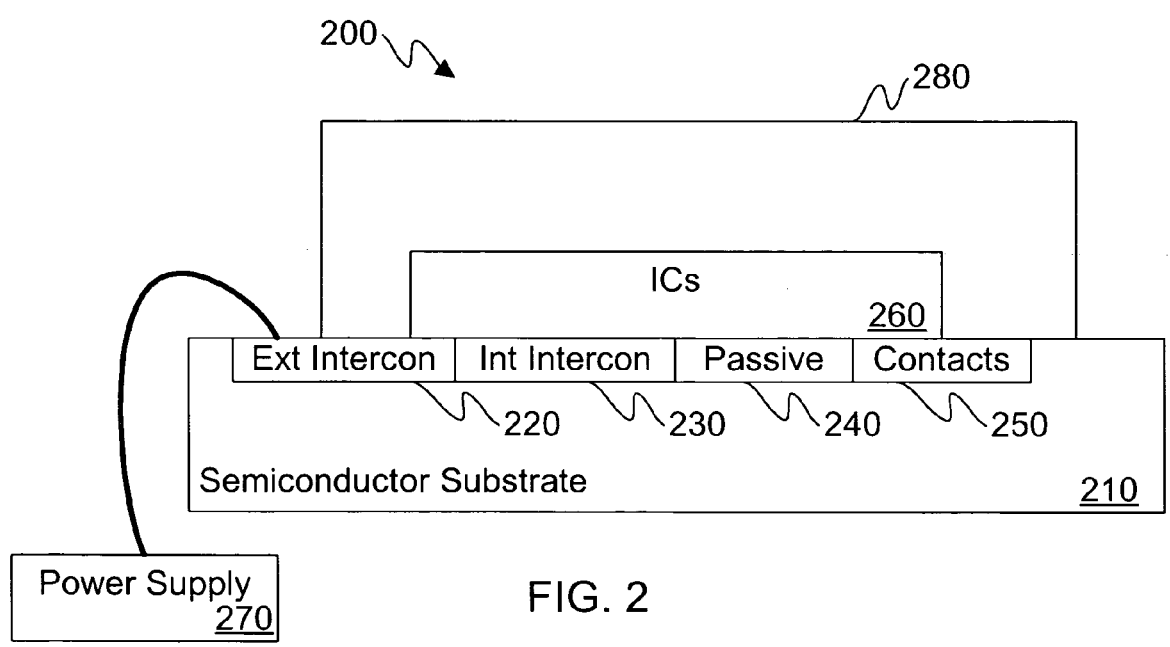
FIG. 2 is a block diagram of a silicon substrate interconnecting integrated electrical circuit components and interconnections in accordance with one embodiment of the invention.

FIG. 2 is a block diagram of a silicon substrate interconnecting integrated electrical circuit components and interconnections in accordance with one embodiment of the invention. Semiconductor substrate 210 includes a semiconductor substrate in which circuit components may be integrated or embedded, with semiconductor processing. The use of silicon as a semiconductor substrate is common. Semiconductor substrate 210 includes external interconnection 220, internal interconnection 230, passive 240, and contacts 250.

External interconnection 220 includes traces, wells, etc., used by system 200 to interconnect to packaging (e.g., pins, leads), other substrates, etc. For example, system 200 may be interconnected with power supply 270 to provide power to the circuits. Power supply 270 may be from a regulated voltage source, battery (a power storage cell), etc. Power supply 270 is typically a direct current (DC) power source. Internal interconnections 230 selectively interconnect the components embedded in semiconductor substrate 210 with each other and/or with ICs 260, which represents one or more integrated circuits that may be connected (e.g., wire bonded, flip-chip bonded) to semiconductor substrate 210.

In one embodiment passive 240 represents passive component(s) monolithically embedded in semiconductor substrate 210 with the same processing used to produce interconnections 220 and/or 230. Passive 240 provides electrical functionality in the circuit of system 200. Thus, passive 240 may modify, filter, or otherwise process signals of system 200.

Contacts 250 represents contact (bonding) pads used to interconnect ICs 260 to internal interconnections 230, which in turn interconnects ICs 260 to other elements of system 200. Contacts 250 may be areas of metal and/or high conductive material used to provide an area of relatively larger size to connect, e.g., wire bonds, bumps, to the interconnection lines/traces of internal interconnections 230. In one embodiment system 200 is enclosed with an enclosing device 280. The enclosing device will be discussed in more detail below.

Figure 3:
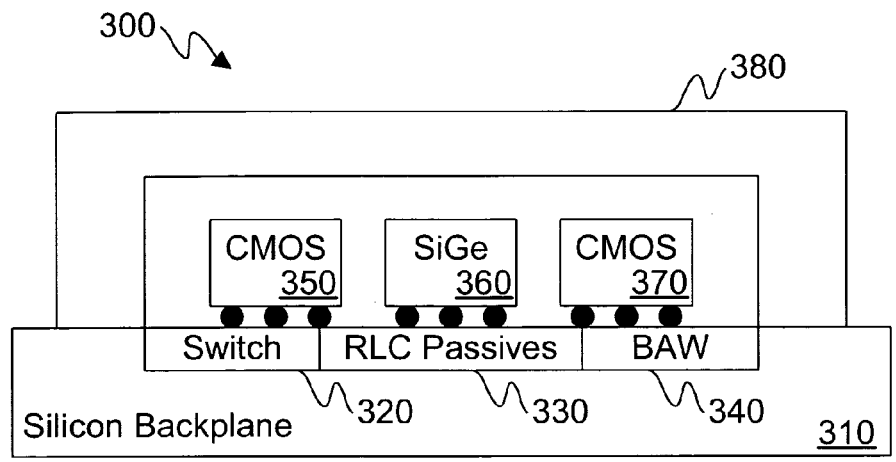
FIG. 3 is a block diagram of interconnecting ICs with a silicon backplane having components processed on the silicon backplane in accordance with one embodiment of the invention.

FIG. 3 is a block diagram of interconnecting ICs with a silicon backplane having components processed on the silicon backplane in accordance with one embodiment of the invention. Silicon backplane 310 is a piece of silicon that may be processed according to silicon processing techniques. Silicon backplane 310 is processed to interconnect various circuit elements in a single system on an IC. System 300 may include various ICs, including CMOS 350, SiGe 360, and CMOS 370. These devices represent any type of IC that may be integrated into system 300 with other ICs in the same packaging. In one embodiment the components of system 300 include silicon-based devices, thus avoiding the expense of boutique processing technologies such as $LiTaO_3$ and GaAs. However, non silicon-based IC devices may also be included in system 300 through integration onto silicon backplane 310. These devices may be electrically attached to contact pads on silicon backplane 310 by bumps or wire bonding. These devices will be selectively interconnected to each other, and to external contact pads according to the design of the system of which they are a part.

The footprint of interconnect lines or traces and contact (bonding) pads, bumps, etc. do not require high precision lithographic processing technology because they generally derive no benefit from scaling. Additionally, note that certain common circuit elements, such as passive components (e.g., resistors, capacitors) do not scale, and may not require a high precision lithographic processing technology to be produced. Thus, all such aspects of a silicon interconnect device may be integrated into the silicon interconnect with the use of non high-end (e.g., 1 µm, 0.5 µm minimum feature size) processing techniques. Note that for certain signaling requirements, traces of a larger size may in fact be desirable for an interconnect device. On such devices, the precision level of high end, state-of-the-art lithography (e.g., feature size of 90 nm, 65 nm) is not needed; a lower precision processing technology may be sufficient. Additionally, the interconnects and passives can be embedded together in a silicon substrate with many fewer processing steps that the numerous steps generally used in high end processing to produce multiple layers of circuit material (e.g., interconnects) on top of the structures actually embedded in the original substrate.

Because silicon backplane 310 includes a semiconductor substrate, in one embodiment it can be processed to have integrated devices, making silicon backplane 310 more than simply a passive interconnect device. Although it provides interconnection for system 300, silicon backplane 310 is also processed with components that provide electrical circuit functionality to system 300. For example, silicon backplane 310 may include switch 320, RLC passives 330, and bulk acoustic wave (BAW) filter 340. More or fewer components may be included in silicon backplane 310.

Note that as the interconnection aspects of silicon backplane 310 may be processed on silicon backplane 310 using non state-of-the-art lithographic processing, the functional elements processed on silicon backplane 310 may also be processed with such lesser-precision lithographic processing technologies. One advantage gained by using the same processing steps is the reduced cost in integrating the functional elements and interconnections with the same processing steps. Although the lithographic (x-y dimensions) technologies involved may be of lesser than state-of-the-art, processing in the vertical direction (z dimension; e.g., thin film deposition, film thickness control) may be state-of-the-art. In one embodiment higher precision processing may be performed on part or all of the material of silicon backplane 310 to manufacture the integrated circuit elements.

Note that the cost of a silicon substrate used as an interconnect device is initially of higher cost than a corresponding organic or ceramic interconnect substrate. The materials of traditional interconnect substrates are cheaper than silicon, and the processing to produce the interconnection is more expensive in silicon, even when using lower-end lithographic precision processing techniques. However, the cost of a silicon substrate interconnect becomes justifiable when functional circuit elements may be manufactured in the silicon backplane, removing some or all of the need for discrete passive components. Cost reduction may also be achieved by having a substrate in which to process silicon-based components as replacements for some ICs produced with boutique processing. By eliminating the need to place some or all high real-estate passives on ICs manufactured with high-end processing technologies, or use discrete passive components that must be integrated onto a system, along with replacing ICs produced with expensive boutique technologies, the overall system costs may actually be lower. With these other costs reduced, the additional cost of the silicon backplane over the passive substrates is more than offset by the savings.

For example, one of the savings potentially achieved by the use of silicon backplane includes the fact that the level of lithographic precision for the embedded devices may be accomplished on equipment that may not be state-of-the-art. Thus, previous generation equipment could be used to produce circuit elements that may otherwise be less efficiently produced on high-end equipment that may be better used to produce highly scalable circuit elements. The production of a system on a single chip may be effectively accomplished by using non state-of-the-art lithographic equipment to produce silicon backplane 310 with its embedded circuit elements and interconnections, and interconnect scalable ICs produced with state-of-the-art equipment.

In one embodiment switch 320 includes a micro electromechanical (MEMS) switch processed on silicon backplane 310 using non high-end lithographic processing. Low insertion loss MEMS switching is known for switching, e.g., between channels of an RF module. RLC passives 330 include discrete elements as well as RLC passive filters for processing input signals. BAW 340 is a film bulk acoustic resonator, which is a silicon-based equivalent of a SAW filter used as an alternative to $LiTaO_3$ SAW filters. SAW filters cannot be monolithically integrated into silicon because they are made with $LiTaO_3$; therefore, these and other components built with boutique processing technologies will remain discrete components, instead of being able to be integrated on silicon backplane 310.

The use of silicon backplane 310 allows for the design of system 300 with state-of-the-art processing technologies to produce ICs that have scaleable circuit components, while allowing offloading of some circuit functions to functional circuit components integrated into silicon backplane 310 that may not have such exacting requirements for manufacturing.

Because MEMS devices are generally hermetically sealed, in an embodiment where MEMS device(s) are used, system 300 is capped with lid 380. Lid 380 may be, for example, a silicon, or silicon-based structure that can be affixed to the material of silicon backplane 310.

Figure 4:
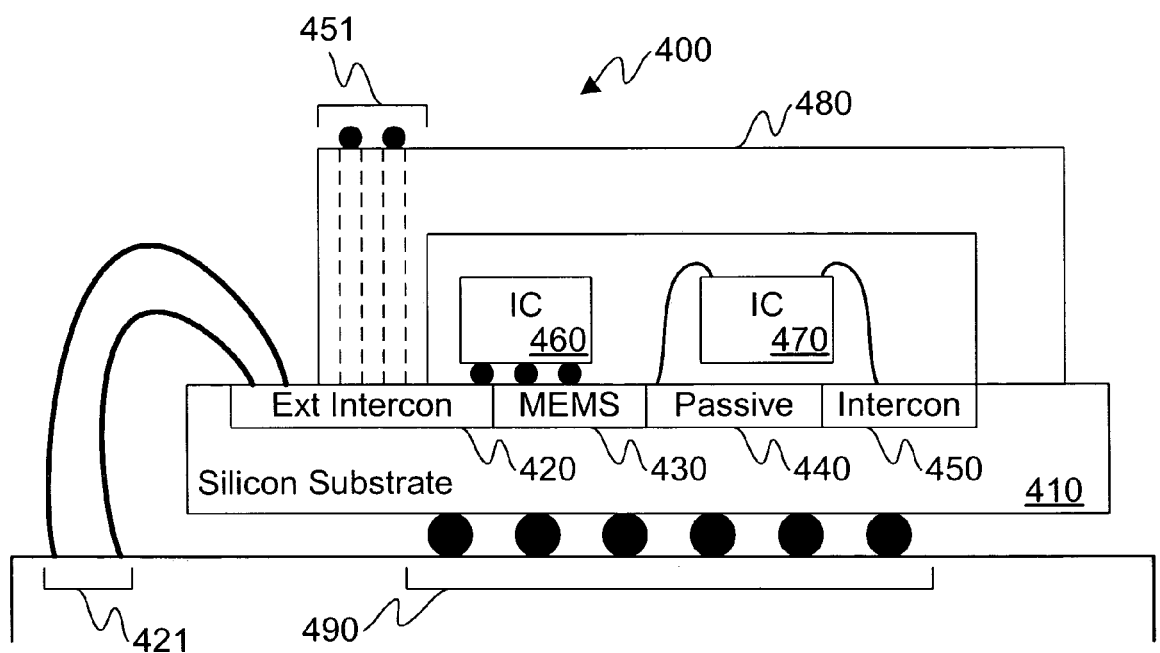
FIG. 4 is a block diagram of externally interconnecting a capped integrated circuit in accordance with one embodiment of the invention.

FIG. 4 is a block diagram of externally interconnecting a capped integrated circuit in accordance with one embodiment of the invention. System 400 is similar to that discussed above in FIG. 3. In one embodiment silicon substrate 410 includes MEMS 430 and passive 440 integrated directly on silicon substrate 410. MEMS 430 and passive 440 are merely examples of functional circuit elements that may be embedded on silicon substrate 410, and are not meant to be restrictive or exclusive of circuit elements that may be embedded in silicon substrate 410.

System 400 also includes exemplary ICs 460 and 470. IC 460 is shown bonded with bumps, and IC 470 is shown bonded with wire bonds. It is to be understood that more or fewer ICs may be included in system 400, and the various ICs may be bonded with bumps, wire bond, or other methods. Interconnections 450 represent the selective internal connections among the devices of system 400. For example, IC 460 may be interconnected to MEMS 430, while IC 470 may not be, etc. Interconnections 450 may also include traces/lines to interconnect IC 460 to IC 470. In one embodiment it will be advantageous for system 400 to have cap 480 over the circuitry.

System 400, once integrated with all of its components, is packaged as an IC in accordance with embodiments of the invention. An IC will typically have electrical connectivity points such as pins/leads on inline or quad packages, or balls on a ball-grid array (BGA) package. To connect system 400 to its packaging, system 400 is provided with external interconnection mechanism(s). Through these interconnections system 400 is able to interface with other ICs, other circuitry, power supplies, etc. In one embodiment silicon substrate 410 is processed with external interconnection 420. If system 400 includes cap 480, external interconnection 420 may extend from the internal region of system 400 that is capped to outside the cap. External interconnection 420 is then bonded to the intended packaging of system 400 via, e.g., wire bonds 421. The use of wire bonds to connect an integrated circuit to its packaging is known.

In one embodiment system 400 includes cap 480, and vias 422 drilled or etched through cap 480 to external interconnection 420. External interconnection 420 is manufactured directly on silicon substrate 410 to provide external connectivity, as with the other interconnection techniques described above. Vias 422 may be, e.g., insulated and then filled or coated with metal and/or have a wire bond used to connect to interconnection 450. It is again to be understood that the interconnections described here may be used alone or in combination, and the description herein is not intended to be limiting regarding a manner to interconnect system 400 to an external connection point.

In one embodiment system 400 is manufactured with silicon vias 490 through silicon substrate 410 to contact pads for the external interconnections. Vias 490 are typically drilled or etched through substrate 410, insulated, and filled or coated with metal to provide electrical connectivity between the contact pads and, for example, conductive traces to the pins, pads, or balls of the packaging.

Figure 5:
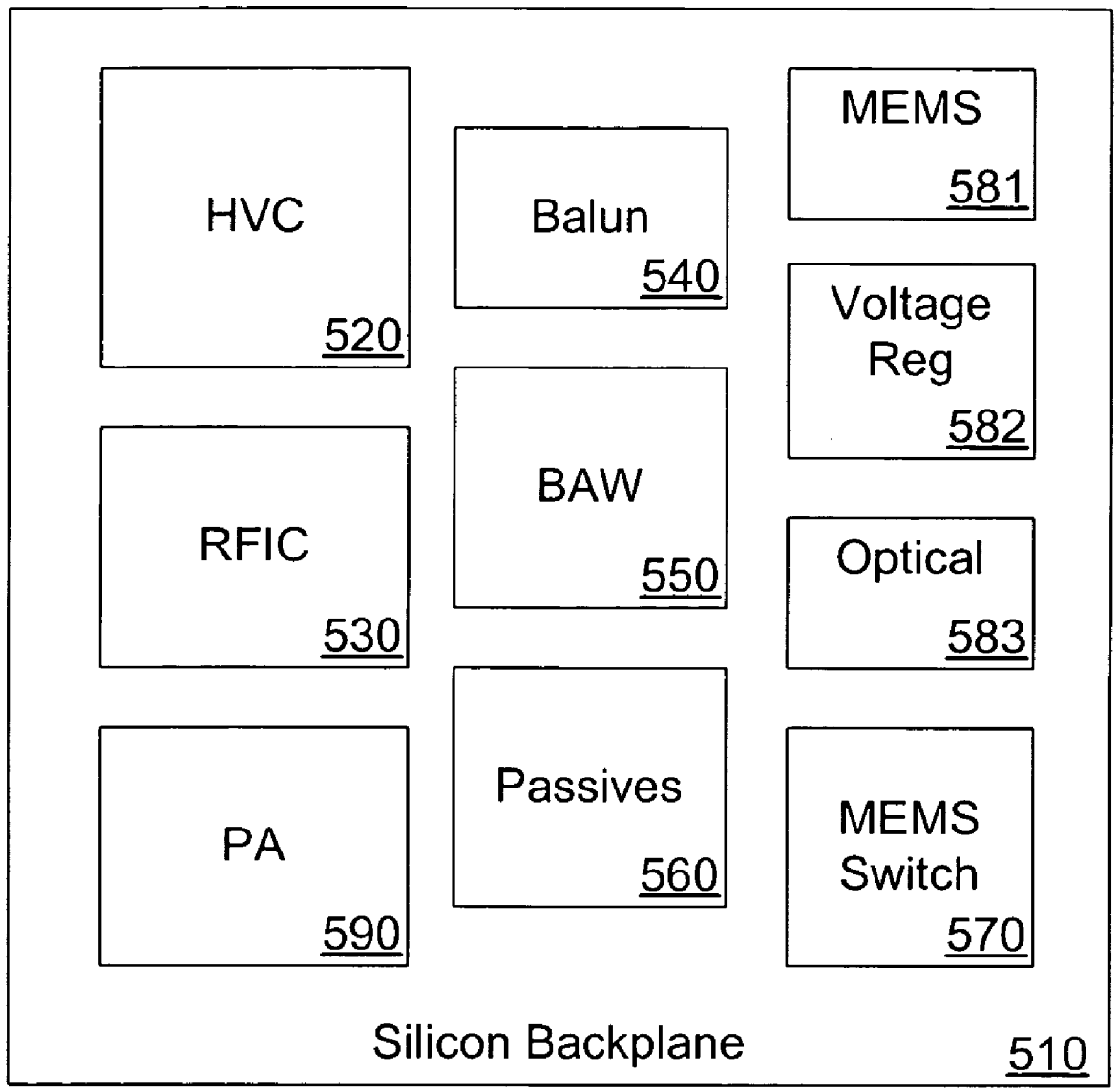
FIG. 5 is a block diagram of circuit elements on a silicon interconnect backplane in accordance with one embodiment of the invention.

FIG. 5 is a block diagram of circuit elements on a silicon interconnect backplane in accordance with one embodiment of the invention. The elements of FIG. 5 are not intended to be shown to scale. In one embodiment the elements on silicon backplane 510 are part of a highly integrated radio module. Silicon backplane 510 includes high voltage chip (HVC) 520 and radio frequency IC (RFIC) 530. HVC 520 represents an integrated circuit (whether separate IC(s) or embedded in silicon backplane 510) that provides the high voltage necessary to actuate some MEMS devices. In a radio module, RFIC 530 may refer to multiple separate components of the radio module, as with a multimode radio module.

Power amplifier (PA) 590 represents a final stage of an RF transmitter that drives an antenna attached to the circuit on silicon backplane 510, in the embodiment where silicon backplane 510 includes an RF module. PA 590 may be an IC bonded to silicon backplane 510. PAs are generally GaAs or SiGe devices and typically require passive matching and tuning networks for maximum efficiency and radiation by the antenna. These matching networks can be processed in silicon backplane 510 while one or more die encompassing PA 590 are connected to silicon backplane 510 with flip chip or wire bonding. HVC 520, RFIC 530, and PA 590 are typically integrated circuits that will be integrated together in a radio module on an interconnect device. These ICs may be integrated on silicon backplane 510 with either wire bond or flip chip bonding. These elements are meant only for purposes of illustration, and other ICs, including ICs unrelated to a radio module, may be included. In one embodiment these ICs represent any kind of IC desirable for a system on a chip design.

In one embodiment silicon backplane 510 includes several components integrated directly on silicon backplane 510 through silicon processing. For purposes of illustration, and not by way of limitation, silicon backplane 510 may include balun 540, BAW 550, passives 560, and MEMS switch 570. Balun 540 represents the many components that make up the circuitry to transform an incoming single-ended radio signal to a differential signal. Because the separate elements of balun 540 are typically components that do not scale, they can be manufactured with the lower-end processing with which silicon backplane 510 is manufactured. This provides good reason to integrate them directly onto silicon backplane 510 rather than as discrete components, or integrated on other ICs.

BAW 550 represents multiple SAW filters made of MEMS in the silicon of silicon backplane 510. In one embodiment BAW 550 is a film bulk acoustic resonator (FBAR) filter. BAW 550 represents what may be multiple discrete BAWs in the system. As with the BAW components, another component that can be processed directly into the silicon of silicon backplane 510 is passives 560. Passives 560 represents discrete resistors, capacitors, and inductors that may be present in an integrated circuit system, as well as LC filters that are typically present in radio modules. In one embodiment the silicon of silicon backplane 510 is high resistivity silicon. Thus, the passives may be manufactured of low-impedance conductor on high-resistivity silicon, which provides better performance in passives 560. The proper manufacturing of the components will result in high-Q passives 560 integrated directly into the silicon of silicon backplane 510.

As part of a radio module, or as part of another system integrated on a single die, silicon backplane 510 may include other circuit components, including, but not limited to: MEMS 581, voltage regulation 582, and optical 583. MEMS 581 is intended to represent a broad range of MEMS devices that may be integrated on an IC. For example, MEMS 481 may include: microfluidic devices with fluid channels, fluid storage (radiators), recombiners, microchannel cooler, and pumps; actuation devices used to trigger events due to force, inclining of a device in which the system is found, etc.; and electrical and/or biological sensor circuits.

Voltage regulation 582 includes regulation circuits to filter noise out of a voltage supply, or convert one voltage to another. Additionally, voltage regulation 582 may include circuits that regulate a non-steady voltage supply into a regulated voltage level.

In one embodiment silicon backplane 510 also includes optical devices 583. This includes, but is not limited to, fiber alignment channels, laser components, etc. In one embodiment silicon backplane is made of high-resistivity silicon, which looks like glass to infrared optical signals. Thus, the use of high-resistivity silicon may be advantageous when optical devices 583 are included in silicon backplane 510. In each of optical 583 and voltage regulation 482, note that these circuits may lend themselves to have active devices, such transistors, diodes, etc.

Although active devices may typically be scaleable, in various circuits, such as embodiments of the circuits mentioned here, active components may be manufactured with non high-end processing technologies because of the nature of the components needed. For example, voltage regulation will typically require larger transistors that can be adequately manufactured for the purposes they serve in their respective circuits with less precise lithography. Thus, even with what may be considered to be scaleable components may be integrated on silicon backplane 510. In one embodiment such active components may be monolithically processed with the interconnections and other circuit elements integrated on silicon backplane 510.

Figure 6:
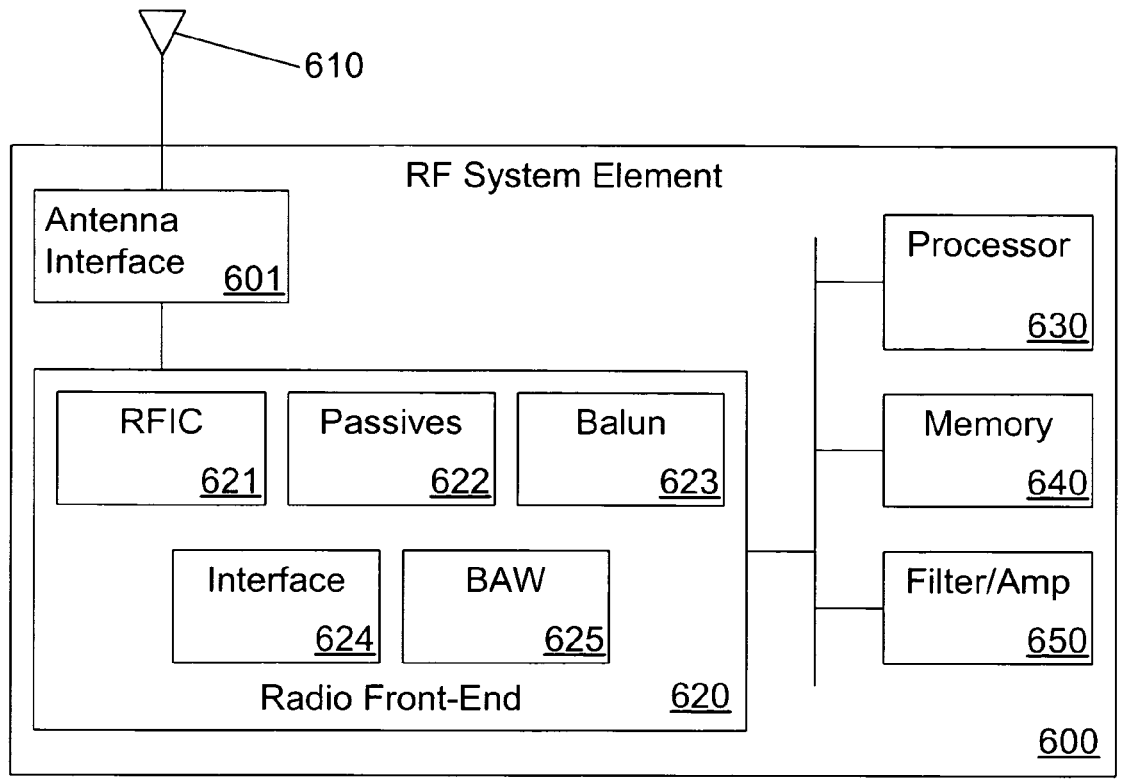
FIG. 6 is a block diagram of circuit elements of a radio frequency (RF) system element having an integrated radio front-end module in accordance with one embodiment of the invention.

FIG. 6 is a block diagram of circuit elements of a radio frequency (RF) system element having an integrated radio front-end module in accordance with one embodiment of the invention. RF system element 600 represents an element of a wireless communications system. Element 600 may be, for example, a wireless access point, a cellular telephone, a laptop computer, a device connected to a wireless local area network (WLAN), etc. In one embodiment RF system element 600 includes an antenna 610. In an alternate embodiment, RF system element 600 is connected with an antenna element 610. In either case, element 600 includes an antenna interface 601 to interconnect antenna 610 to other system components of element 600.

In one embodiment RF system element 600 includes a radio front-end 620. The radio front-end may be an integrated circuit as described above, with multiple circuit components integrated in a single package. Radio front-end 620 is shown including radio frequency integrated circuit (RFIC) 621, passive elements/components 622, balun components 623, interface 624, and bulk acoustic wave filter (BAW) 625. It is to be understood that these are merely illustrative, and radio front-end 620 may include more or fewer components than what is shown in FIG. 6.

RFIC 621 represents one or more processing elements to, for example, demodulate a received signal or a modulate a digital signal for transmission. RFIC 621 may include circuits generated with CMOS processing technologies. In one embodiment, RFIC 621 is a silicon-based integrated circuit prepared for bonding/connecting to radio-front end 620 by wirebond, flip-chip, etc. Passives 622 represent one or more components integrated directly into the bulk silicon of a silicon backplane/substrate of radio-front end 620 through silicon processing. Passives 620 may include one or more discrete resistors, capacitors, and/or inductors that may be present in an integrated circuit system, as well as LC filters that may be present in a radio front-end. When integrated onto a high resistivity silicon, the passives may be manufactured of low-impedance conductor on high-resistivity silicon for a high Q in these components. Balun 623 represents the components that make up the circuitry to transform an incoming single-ended radio signal to a differential signal. In one embodiment BAW 550 may represent a SAW filter constructed of MEMS in the bulk silicon of an SoC including radio front-end 620. In one embodiment BAW 620 is a film bulk acoustic resonator (FBAR) filter. The components described may be integrated directly onto a common semiconductor substrate, as is described above.

In one embodiment radio front-end 620 is interconnected with one or more of processor 630, memory 640, and/or filter/amp 650. Processor 630 represents one or more processors, for example, a signal processor, such as a digital signal processor (DSP) for processing signals transmitter from/received by radio front end 620. In one embodiment processor 630 may include functions other than those directly associated with processing of signals, for example, providing a user interface for RF system element 600. A user interface may include a screen display (e.g., a liquid crystal display), a light emitting diode (LED), an audio or tactile interface, etc. In one embodiment, processing relating to modulating/demodulating a signal, providing analog to digital (or vice versa), decoding/encoding a signal, etc., is accomplished on RFIC 621. In an alternate embodiment one or more of these functions may be accomplished in conjunction with processor 630.

In one embodiment RF system element 600 includes one or more memory elements 640, e.g., buffers, system memory, cache, random access memory (RAM) synchronous dynamic RAM (SDRAM), Flash, etc. Memory 640 may provide storage for data signals. RF system element 600 may also include filter/amp 650, which represents one or more filters and/or amplifiers that may be included in RF system element 600 to provide signal grooming and/or scaling of a signal in RF system element 600. In one embodiment filter/amp 650 interfaces radio front-end 620 with processor 630.

Figure 7:
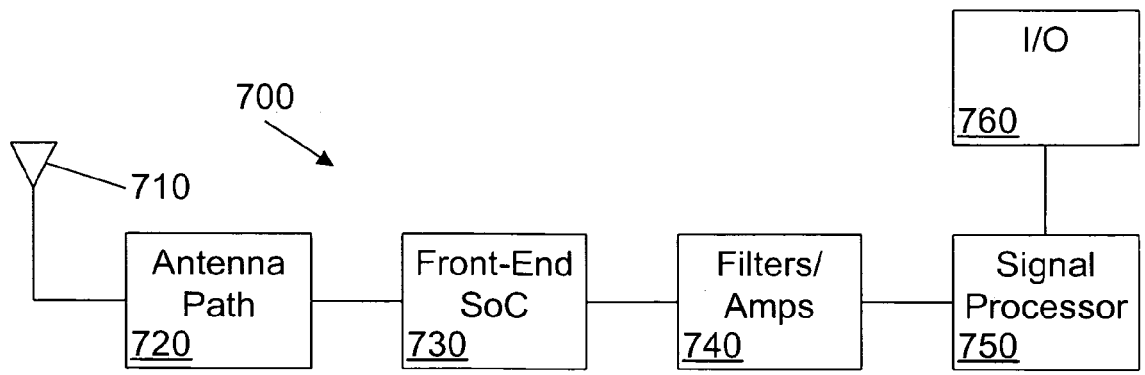
FIG. 7 is a block diagram of circuit elements of a wireless communication system including a front-end circuit system-on-a-chip in accordance with one embodiment of the invention.

FIG. 7 is a block diagram of circuit elements of a wireless communication system including a front-end circuit system-on-a-chip in accordance with one embodiment of the invention. In one embodiment system 700 represents a receive path for signals received on antenna element 710. In another embodiment system 700 represents a transmit path for signals to be transmitter over antenna 710. Antenna path 720 represents one or more signal lines or signal paths for a transmitted/received signal. In one embodiment path 720 may include pre-filters and/or matching components to interface antenna 710 to front-end SoC 730.

Front-end SoC 730 represents a system-on-a-chip, or integrated, wireless/radio front-end. Front-end SoC 730 may perform multiple functions as is known in the art. In one embodiment, front-end SoC 730 may include an all silicon-based integrated circuit handling the front-end functions of system 700. For example, front-end SoC 730 may include circuit components monolithically integrated into an SoC backplane together with contacts/interconnections. In traditional systems only the interconnections between components are integrated on the SoC backplane. Additionally, traditional front-end modules include one or more components of a non-silicon, or boutique, technology. By using only silicon-based components, front-end SoC 730 may provide a less expensive solution than traditional systems with comparable functionality. By integrating components into the backplane of the SoC, cost may be further reduced by reducing the need for discrete passive components, filters, etc.

In one embodiment system 700 includes filters/amps 740, which represent one or more components to shape and/or scale a signal in system 700. This may be used, for example, to interface front-end SoC 730 with signal processor 750. Note that in one embodiment the functions/components of filters/amps 740 may be included in front-end SoC 730, e.g., integrated into the backplane. This provides a compact solution, allowing for a smaller-form wireless device (e.g., cell phone, wireless card, access point, etc.).

In one embodiment system 700 may include I/O 760, which represents input and output interfaces/components that may be present in a wireless device, e.g., a cell phone, a wireless handheld computing device, etc. The one or more components of I/O 760 may provide functionality in a device for a user. For example, through I/O 760, a user of a device including system 700 may send and receive voice and/or data messages. I/O 760 may include a liquid crystal display (LCD), mechanical buttons and/or switches, touch-screens, soft keys (e.g., icons, buttons), etc. In one embodiment I/O 760 includes an audio interface component, for example, a speaker, a piezo-electric element, a microphone circuit, etc.

I/O 760 may be directly connected with processor 750, or may be indirectly coupled with processor 750. In one embodiment processor 750 may control/manage I/O 760, e.g., through direct commands to I/O 760, commands to a control circuit of I/O 760, over a communication bus, over dedicated signal lines, etc. In one embodiment signal processor 750 represents multiple processors in system 700, for example, with a processor to control I/O 760 and a processor to perform digital signal processing on wireless signals received at antenna 710. If multiple processors are used in a system, one processor may operate as a central processor with one or more processors in communication with the central processor, and executing application specific functions.

Reference herein to "one embodiment" or "an embodiment" means that a particular feature, structure or characteristic described in connection with the embodiment is included in at least one embodiment of the present invention. Thus, the appearance of phrases such as "in one embodiment," or "in another embodiment" describe various embodiments of the invention, and are not necessarily all referring to the same embodiment. Besides the embodiments described herein, it will be appreciated that various modifications may be made to embodiments of the invention without departing from their scope. Therefore, the illustrations and examples herein should be construed in an illustrative, and not a restrictive sense. The scope of the invention should be measured solely by reference to the claims that follow.

What is claimed is:

1. A radio frequency (RF) front-end module comprising:
   an interface to an antenna element;
   an interface to an RF signal filter; and
   a semiconductor substrate having a capacitive passive circuit element monolithically integrated into the substrate and a contact point for connecting a separate integrated circuit (IC) to the substrate, the capacitive circuit element and the IC forming a system-on-a-chip (SoC), the SoC coupled with the antenna element interface and the RF signal filter interface.

2. An RF front-end module according to claim 1, further comprising a resistive passive circuit element monolithically integrated into the substrate on the SoC.

3. An RF front-end module according to claim 1, further comprising a semiconductor bulk acoustic wave filter monolithically integrated into the substrate on the SoC.

4. An RF front-end module according to claim 1, further comprising a balun circuit monolithically integrated into the substrate on the SoC.

5. An RF front-end module according to claim 1, wherein the semiconductor substrate and the separate IC comprise silicon-based technologies.

6. An RF front-end module according to claim 5, wherein the front-end module includes only silicon-based technologies.

7. A wireless network element comprising:
an antenna;
a front-end module coupled with the antenna to receive or transmit a signal from/to the antenna, the front-end module having a front-end circuit chip with a silicon substrate with passive circuit components and signal filter components monolithically integrated onto the silicon substrate, and a processing circuit on a separate substrate, the processing circuit bonded to the silicon substrate; and
a processor coupled with the front-end module to receive a signal for processing from the front-end module if the front-end module receives a signal from the antenna, or transmit a signal to the front-end module to modulate the signal for transmission from the antenna.

8. A wireless network element according to claim 7, wherein the wireless network element comprises a cellular telephone.

9. A wireless network element according to claim 7, wherein the wireless network element comprises a wireless access point.

10. A wireless network element according to claim 7, wherein the wireless network element comprises a wireless network card.

11. A wireless network element according to claim 7, wherein the wireless network element comprises a laptop computer.

12. A wireless network element according to claim 7, wherein the signal filter components comprise a film bulk acoustic resonator filter.

13. A radio front-end circuit comprising:
a balun circuit to interface a single-ended and a differential version of a signal;
a tuning capacitor; and
a silicon-based radio frequency processing integrated circuit (RFIC);
wherein the balun circuit, the tuning capacitor, and the RFIC are interconnected on a silicon backplane, the silicon backplane having the interconnections processed into the bulk silicon of the silicon backplane with a series of processing steps, the silicon backplane further having contacts processed into the bulk silicon with the same series of processing steps, the RFIC bonded to the silicon backplane via the contacts, and the balun circuit and the tuning capacitor processed into the bulk silicon with the same series of processing steps.

14. A radio front-end circuit according to claim 13, further comprising an acoustic wave filter interconnected with the RFIC in the silicon backplane, the acoustic wave filter processed into the bulk silicon with the same series of processing steps.

15. A radio front-end circuit according to claim 13, wherein the tuning capacitor includes micro electromechanical system (MEMS) elements.

16. A radio front-end circuit according to claim 15, further comprising an integrated circuit including a high voltage interface (HVIC) to drive the MEMS elements, the HVIC coupled with the tuning capacitor in the silicon backplane.

17. A wireless handheld device comprising:
an antenna;
a transceiver coupled with the antenna having a radio frequency front-end circuit with a passive circuit component, a signal filter component, a balun circuit, interconnect lines, and bonding pads monolithically integrated in a bulk silicon substrate, the bonding pads to receive and interconnect an integrated circuit chip, the transceiver to transmit and receive signals from a processor; and
an input/output (I/O) interface coupled with the processor to provide access to a user to functions of the wireless handheld device.

18. A wireless handheld device according to claim 17, wherein the processor comprises a central processor, the central processor to manage the I/O interface and the transceiver.

19. A wireless handheld device according to claim 17, wherein one or more of the signal filter component, the balun circuit, or the bonding pads includes a micro electromechanical system (MEMS) component.

20. A wireless handheld device according to claim 19, wherein the transceiver further comprises a high voltage interface circuit monolithically integrated in the bulk silicon backplane to provide switching voltages for a MEMS component of the transceiver.

* * * * *